United States Patent
Choi

(10) Patent No.: US 7,433,248 B2
(45) Date of Patent: *Oct. 7, 2008

(54) SYSTEM AND METHOD FOR ENHANCED MODE REGISTER DEFINITIONS

(75) Inventor: Joo S. Choi, Yongin (KR)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/701,120

(22) Filed: Jan. 31, 2007

(65) Prior Publication Data

US 2007/0140022 A1 Jun. 21, 2007

Related U.S. Application Data

(63) Continuation of application No. 11/106,741, filed on Apr. 14, 2005, now Pat. No. 7,184,327.

(51) Int. Cl.
*G11C 7/10* (2006.01)

(52) U.S. Cl. .............................. 365/189.08; 365/230.03; 365/230.08

(58) Field of Classification Search ............ 365/189.05, 365/191, 189.08, 189.12, 230.05, 230.08, 365/230.015

See application file for complete search history.

(56) References Cited

U.S. PATENT DOCUMENTS

| | | | | |
|---|---|---|---|---|
| 4,519,028 A | | 5/1985 | Olsen et al. ................. 364/200 |
| 5,390,352 A | * | 2/1995 | Kinoshita ...................... 712/7 |
| 5,893,927 A | | 4/1999 | Hovis .......................... 711/171 |
| 5,953,263 A | | 9/1999 | Farmwald et al. ........... 365/194 |
| 5,954,804 A | | 9/1999 | Farmwald et al. ............. 710/36 |
| 6,026,465 A | | 2/2000 | Mills et al. ................... 711/103 |
| 6,034,918 A | | 3/2000 | Farmwald et al. ........... 365/233 |
| 6,038,195 A | | 3/2000 | Farmwald et al. ........... 365/233 |
| 6,289,413 B1 | | 9/2001 | Rogers et al. ................ 711/105 |
| 6,304,497 B1 | | 10/2001 | Roohparvar ........... 365/194.04 |
| 6,404,684 B2 | * | 6/2002 | Arimoto et al. ............. 365/201 |
| 6,415,339 B1 | | 7/2002 | Farmwald et al. ............. 710/23 |
| 6,651,196 B1 | * | 11/2003 | Iwase et al. .................. 714/724 |
| 6,687,184 B2 | | 2/2004 | Johnson et al. ............. 365/233 |
| 6,697,295 B2 | | 2/2004 | Farmwald et al. ........... 365/233 |
| 6,713,778 B2 | | 3/2004 | Maeda ........................ 257/10 |
| 6,762,617 B2 | * | 7/2004 | Iwase et al. .................... 326/11 |
| 6,768,690 B2 | | 7/2004 | Kwon .......................... 365/194 |
| 6,785,764 B1 | | 8/2004 | Roohparvar ................. 711/103 |
| 6,785,765 B1 | | 8/2004 | Roohparvar ................. 711/103 |
| 6,789,210 B2 | | 9/2004 | Satoh et al. .................. 713/501 |
| 7,111,143 B2 | | 9/2006 | Walker ........................ 711/170 |
| 7,184,327 B2 | * | 2/2007 | Choi ...................... 365/189.08 |
| 2004/0019756 A1 | | 1/2004 | Perego et al. ................ 711/170 |
| 2005/0024980 A1 | | 2/2005 | Roohparvar ................. 365/232 |
| 2005/0268022 A1 | | 12/2005 | Pelley ............................ 711/5 |
| 2006/0161745 A1 | | 7/2006 | Lee et al. ..................... 711/154 |
| 2007/0088921 A1 | * | 4/2007 | Kim et al. .................... 711/154 |

* cited by examiner

*Primary Examiner*—Son Dinh
*Assistant Examiner*—Hien N Nguyen
(74) *Attorney, Agent, or Firm*—Dorsey & Whitney, LLP

(57) ABSTRACT

Apparatus and methods for increasing a number of selectable options for an operating mode. A number of selectable options for an operating mode is increased by programming a first register with data selecting one of a set of options for the operating mode. A second register is programmed with data selecting one of a plurality of sets of options for the operating mode. The data programmed in the first register selects one of the options of the set of options selected by the data programmed in the second register.

26 Claims, 5 Drawing Sheets

| B2 | B1 | B0 | A11 | A10 | A9 | A8 | A7 | A6 | A5 | A4 | A3 | A2 | A1 | A0 |
|----|----|----|-----|-----|----|----|----|----|----|----|----|----|----|----|
|    |    |    | WRITE LATENCY | | | DLL | TM | CAS LATENCY | | | BT | BURST LENGTH | | |
|    | 000 |   |     |     |    |    |    |    |    |    |    |    |    |    |

WRITE LATENCY

| A11 | A10 | A9 | WL |
|-----|-----|----|----|
| 0   | 0   | 0  |    |
| 0   | 0   | 1  | 1  |
| 0   | 1   | 0  | 2  |
| 0   | 1   | 1  | 3  |
| 1   | 0   | 0  | 4  |
| 1   | 0   | 1  |    |
| 1   | 1   | 0  |    |
| 1   | 1   | 1  |    |

TM

| A7 | TM |
|----|----|
| 0  | normal |
| 1  | test |

DLL

| A8 | DLL |
|----|-----|
| 0  | normal |
| 1  | reset |

CAS LATENCY

| A6 | A5 | A4 | CL |
|----|----|----|----|
| 0  | 0  | 0  | 8  |
| 0  | 0  | 1  | 9  |
| 0  | 1  | 0  | 10 |
| 0  | 1  | 1  | 11 |
| 1  | 0  | 0  | 12 |
| 1  | 0  | 1  | 5  |
| 1  | 1  | 0  | 6  |
| 1  | 1  | 1  | 7  |

BURST LENGTH

| A2 | A1 | A0 | BL |
|----|----|----|----|
| 0  | 1  | 0  | 4  |
| 0  | 1  | 1  | 8  |

BT

| A3 | BT |
|----|----|
| 0  | sequential |
| 1  | interleaved |

Fig. 2B

| B2 | B1 | B0 | A11 | A10 | A9 | A8 | A7 | A6 | A5 | A4 | A3 | A2 | A1 | A0 |
|----|----|----|-----|-----|----|----|----|----|----|----|----|----|----|----|
|    | 010 |   | RFU | | | | | | | | | | | CLOF |

When CLOF = "1"

| A6 | A5 | A4 | CL |
|----|----|----|----|
| 0  | 0  | 0  | 16 |
| 0  | 0  | 1  | 17 |
| 0  | 1  | 0  | 18 |
| 0  | 1  | 1  | 19 |
| 1  | 0  | 0  | 20 |
| 1  | 0  | 1  | 13 |
| 1  | 1  | 0  | 14 |
| 1  | 1  | 1  | 15 |

Fig. 4A

| B2 | B1 | B0 |
|---|---|---|
| | | 000 |

| A11 | A10 | A9 | A8 | A7 | A6 | A5 | A4 | A3 | A2 | A1 | A0 |
|---|---|---|---|---|---|---|---|---|---|---|---|
| WRITE LATENCY | | | DLL | ODS | CAS LATENCY | | | BT | BURST LENGTH | | |

BURST LENGTH

| A2 | A1 | A0 | BL |
|---|---|---|---|
| 0 | 1 | 0 | 4 |
| 0 | 1 | 1 | 8 |

BT

| A3 | BT |
|---|---|
| 0 | sequential |
| 1 | |

CAS LATENCY

| A6 | A5 | A4 | CL |
|---|---|---|---|
| 0 | 0 | 0 | 8 |
| 0 | 0 | 1 | 9 |
| 0 | 1 | 0 | 10 |
| 0 | 1 | 1 | 11 |
| 1 | 0 | 0 | 12 |
| 1 | 0 | 1 | 5 |
| 1 | 1 | 0 | 6 |
| 1 | 1 | 1 | 7 |

ODS

| A7 | ODS |
|---|---|
| 0 | 100% |
| 1 | 60% |

DLL

| A8 | DLL |
|---|---|
| 0 | normal |
| 1 | reset |

WL

| A11 | A10 | A9 | WL |
|---|---|---|---|
| 0 | 0 | 0 | |
| 0 | 0 | 1 | 1 |
| 0 | 1 | 0 | 2 |
| 0 | 1 | 1 | 3 |
| 1 | 0 | 0 | 4 |
| 1 | 0 | 1 | |
| 1 | 1 | 0 | |
| 1 | 1 | 1 | |

Fig. 4B

| B2 | B1 | B0 |
|---|---|---|
| | | 010 |

| A11 | A10 | A9 | A8 | A7 | A6 | A5 | A4 | A3 | A2 | A1 | A0 |
|---|---|---|---|---|---|---|---|---|---|---|---|
| RFU | | | | | | | | | | DSOF | CLOF |

When CLOF = "1"

| A6 | A5 | A4 | CL |
|---|---|---|---|
| 0 | 0 | 0 | 16 |
| 0 | 0 | 1 | 17 |
| 0 | 1 | 0 | 18 |
| 0 | 1 | 1 | 19 |
| 1 | 0 | 0 | 20 |
| 1 | 0 | 1 | 13 |
| 1 | 1 | 0 | 14 |
| 1 | 1 | 1 | 15 |

When DSOF = "1"

| A7 | ODS |
|---|---|
| 0 | 33% |
| 1 | RFU |

SYSTEM AND METHOD FOR ENHANCED MODE REGISTER DEFINITIONS

This application is a continuation of U.S. patent application No. 11/106,741, filed Apr. 14, 2005, now U.S. Pat. No. 7,184,327.

TECHNICAL FIELD

The invention relates generally to setting modes of operation, and more specifically, setting a mode of operation using information stored in more than one mode register.

BACKGROUND

Semiconductor memory devices are used to store digital data. These memory devices are typically used in computer processing systems where a processor can read data from and write data to the memory device. There are various types of memory devices, including volatile memory and non-volatile memory. Generally, volatile memory devices will store data only when power is applied. In contrast, non-volatile memory can continue to store data even when power is no longer applied. A common volatile memory is synchronous dynamic random access memory ("SDRAM").

The SDRAMs are "synchronous" because a clock signal is applied to the memory device, and operation of the SDRAM is based on the clock signal. For example, a read command is provided to the SDRAM by a processor in the form of a combination of command signals. The logic states of the command signals are latched in response to a rising edge of the clock signal. A command decoder decodes the latched read command and generates internal signals to perform the read operation. At a known time after the read command is latched, data is provided at input-output data terminals to be read. The time is typically specified in terms of the number of clock cycles that elapse after the read command is latched. By having the SDRAM and the processor synchronized to the same clock signal, the processor will be able to latch the data at a known time after it issued the read command. Having synchronous operation also allows commands to be provided to the SDRAM in a "pipeline" fashion, where the commands are issued one after another in response to the clock signal, rather than waiting until a previous operation completes before issuing a new command.

The SDRAM devices are designed to be used in a variety of applications and conditions, such as different voltage conditions, different timing conditions, different power conditions, and the like. As a result, SDRAM devices are designed with various programmable operating modes that can be set to enable operation in the various conditions or environments. Examples of programmable operating modes includes burst length, CAS latency, test mode option, and the like. The operating modes are typically programmed through the use of mode registers, which can be programmed with binary digits, or bits, that correspond to the desired option of each of the operating modes defined for the register. The bits of a mode register are allocated to the operating modes defined for the register in a way to provide a suitable number of options for the particular operating mode. For example, if it is desirable for an operating mode, such as CAS latency, to have four different choices, then two bits are defined for selecting one of four CAS latency options. In contrast, for an operating mode, such as a test mode option where the options are either normal operation or test mode operation, only one bit needs to be defined for selecting the desired operating mode for the test mode option. Additionally, all of the bits of a mode register are typically allocated to the operating modes defined for the mode register. That is, if a mode register is 12-bits wide, and has six operating modes defined, changing the bit allocation or the operating modes defined for the mode register requires one of the six operating modes to sacrifice a bit allocated to it or eliminating one of six the operating modes from the mode register.

Neither approach is desirable because changing the operating mode definitions for a mode register or the bit allocation for the operating modes may preclude use of the memory device in legacy systems. That is, the operating modes of a new memory device may not be programmed correctly by a memory controller of an older legacy system that is compatible with an older memory device. In designing a memory device, however, to the extent possible, it is desirable for the memory device to be designed to have the flexibility to work in newer applications as well as work in legacy systems. For example, newer applications often have system clocks having much higher frequency than legacy systems. In some cases, the clock frequency can be two- or three-times the frequency of an older system. It is desirable for a memory device to be able to function in both environments. However, it may be difficult to provide a sufficient number of options for an operating mode that works with both a legacy system and the new application.

One such operating mode is CAS latency, which is a delay in clock cycles between the registration of a read command by the memory device and the availability of the first bit of output data on the data terminals. A CAS latency is needed since a minimum time is required for the memory device to complete a read operation internally. With the internal access time essentially fixed, the number of clock cycles defining the delay is different for different clock frequencies. Generally, the appropriate CAS latency for higher frequency clocks is greater than for lower frequency clocks. Thus, in order for a memory device to have applicability for different systems having different system clock frequencies, the memory device should have a sufficiently broad range of CAS latencies.

Even if the memory device is designed to have a greater range of CAS latencies by increasing the number of bits allocated to selecting a CAS latency, however, the modification of the mode register to accommodate the greater number of selections may result in another problem that also limits the applicability of the memory device in legacy systems. Namely, by changing the bit definition of the CAS latency operating mode, for example, by increasing the bits used to select a CAS latency, the memory controller of a legacy system may be unable to program the appropriate CAS latency under the new definition for the CAS latency operating mode. That is, the memory controller of the legacy system may be incapable of programming the additional bit now allocated to selecting a CAS latency since at the time the memory controller was programmed, the definition of options for the CAS latency operating mode was different. Additionally, as previously discussed, allocating another bit to the CAS latency operating mode will most likely require redefining the bit allocation for the other operating modes, or moving an operating mode to another mode register. In this case, the memory controller in a legacy system that was programmed to set the various operating modes for a memory device will be completely unsuitable for programming a newer memory device having operating mode definitions completely different than the definitions for which the memory controller was programmed to select.

Therefore, there is a need for an alternative apparatus and methods that can be used to provide additional selectable options for an operating mode, and in some applications, allow for compatibility with legacy systems.

SUMMARY

Embodiments of the present invention are directed to apparatus and methods for increasing a number of selectable options for an operating mode. In one aspect of the invention, a number of selectable options for an operating mode of a semiconductor memory is increased by programming a first register with data selecting one option of a set of options for the operating mode, and programming a second register with data selecting one of a plurality of sets of options for the operating mode. The data programmed in the first register selects one of the options of the set of options selected by the data programmed in the second register.

In another aspect of the invention, a command decoder for generating internal control signals in response to receiving command signals includes first and second mode registers. The first mode register is configured to be programmed with data selecting an option from a respective set of options for a plurality of operating modes where each of the plurality of operating modes having a respective set of options. The second mode register is configured to be programmed with data selecting one of a plurality of sets of options for at least one of the plurality of operating modes. The command decoder further includes command decoder logic coupled to the first and second mode registers. The command decoder is configured to generate the internal control signals based on the command signals and the programmed data of the first and second mode registers.

BRIEF DESCRIPTION OF THE DRAWINGS

FIGS. 2A and 2B are diagrams of mode register definitions for various operating modes in accordance with an embodiment of the present invention.

FIGS. 4A and 4B are diagrams of mode register definitions for various operating modes in accordance with an alternative embodiment of the present invention.

DETAILED DESCRIPTION

Certain details are set forth below to provide a sufficient understanding of the invention. However, it will be clear to one skilled in the art that the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
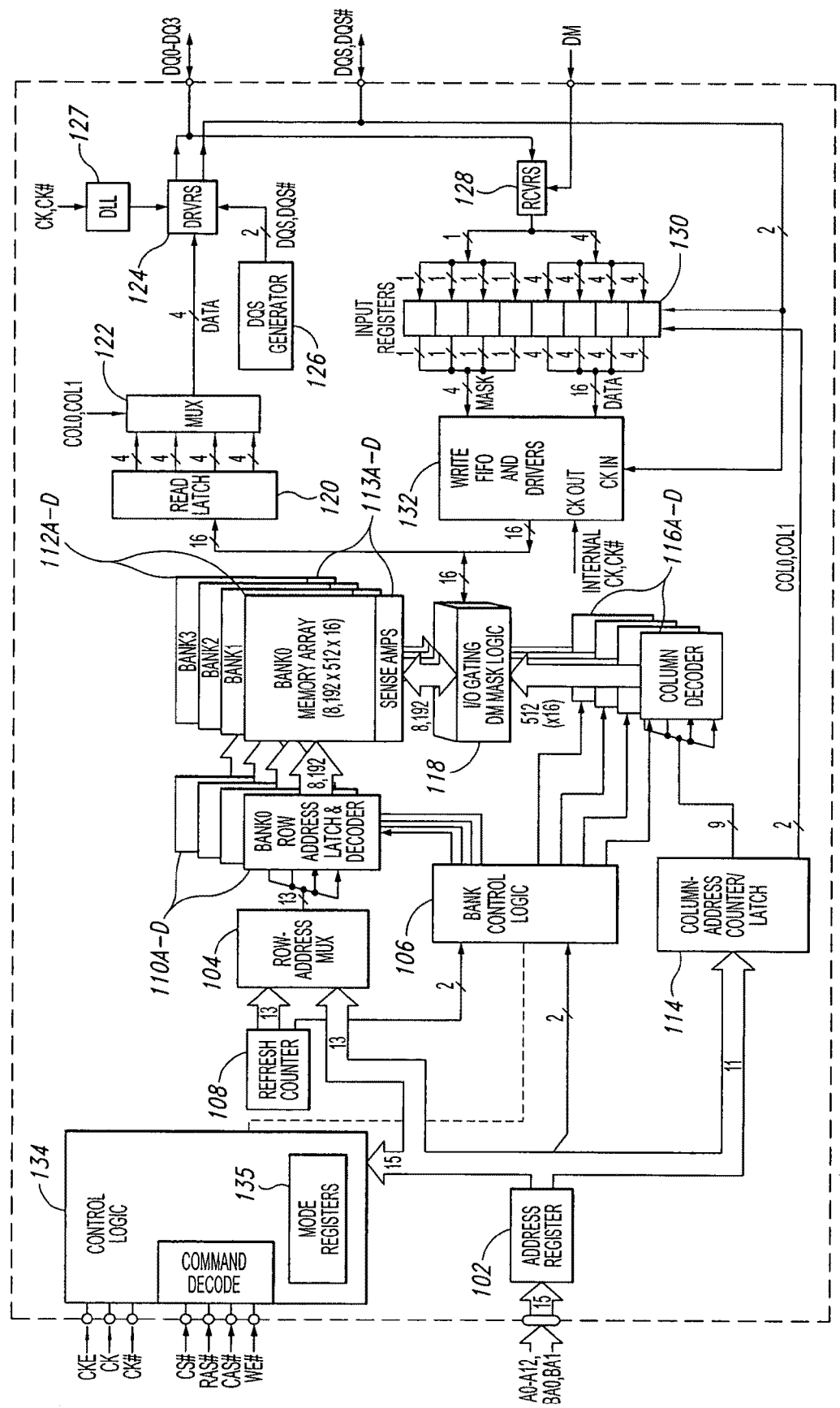
FIG. 1 is a functional block diagram of a memory device in which an embodiment of the present invention is implemented.

FIG. 1 illustrates a memory device in an embodiment of the present invention can be implemented. Application of the principles described herein, however, is not limited to only memory devices and may be applied in other systems having programmable operating modes as well. A general description of the memory device 100 and its operation is provided below, and will be followed by a more detailed description of various embodiments of the present invention.

The memory device 100 in FIG. 1 is a double-data rate ("DDR") SDRAM. The memory device 100 is referred to as a double-data-rate device because the data words being transferred to and from the memory device 100 are transferred at double the rate of a conventional SDRAM, which transfers data at a rate corresponding to the frequency of the applied clock signal. The memory device 100 includes a control logic and command decoder 134 that receives a plurality of command and clocking signals over a control bus, typically from an external circuit such as a memory controller (not shown). The command signals include a chip select signal CS#, a write enable signal WE#, a column address strobe signal CAS#, and a row address strobe signal RAS#, while the clocking signals include a clock enable signal CKE# and complementary clock signals CLK, CLK#, with the "#" designating a signal as being active low. The command signals CS#, WE#, CAS#, and RAS# are driven to values corresponding to a particular command, such as a read, write, or auto-refresh command. The command decoder 134 includes a mode register 135 that can be programmed to set various operating modes of the memory device 100. As will be described in more detail below, the mode register 135 includes a first mode register that can be programmed to select one option for a set of options for a particular operating mode, and further includes a second mode register that can be programmed to select one of a plurality of sets of options for the particular operating mode.

In response to the clock signals CLK, CLK#, the command decoder 134 latches and decodes an applied command. The command decoder 134 generates a sequence of clocking and control signals for control components 102-132 to execute the function of an applied command. Where the clocking and control signals are affected by one of the operating modes, the command controller generates the clocking and control signals accordingly. The clock enable signal CKE enables clocking of the command decoder 134 by the clock signals CLK, CLK#. The memory device 100 further includes an address register 102 that receives row, column, and bank addresses over an address bus, with a memory controller (not shown) typically supplying the addresses. The address register 102 receives a row address and a bank address that are applied to a row address multiplexer 104 and bank control logic circuit 106, respectively. The row address multiplexer 104 applies either the row address received from the address register 102 or a refresh row address from a refresh counter 108 to a plurality of row address latch and decoders 110A-D. The bank control logic 106 activates the row address latch and decoder 110A-D corresponding to either the bank address received from the address register 102 or a refresh bank address from the refresh counter 108, and the activated row address latch and decoder latches and decodes the received row address.

The activated row address latch and decoder 110A-D applies various signals to a corresponding memory bank 112A-D to thereby activate a row of memory cells corresponding to the decoded row address in response to the decoded row address. Each memory bank 112A-D includes a memory-cell array having a plurality of memory cells arranged in rows and columns, and the data stored in the memory cells in the activated row is stored in sense amplifiers in the corresponding memory bank. The row address multiplexer 104 applies the refresh row address from the refresh counter 108 to the decoders 110A-D. The bank control logic circuit 106 uses the refresh bank address from the refresh counter when the memory device 100 operates in an auto-refresh or self-refresh mode of operation in response to an auto- or self-refresh command being applied to the memory device 100, as will be appreciated by those skilled in the art.

A column address is applied on the address bus after the row and bank addresses, and the address register 102 applies the column address to a column address counter and latch 114 which, in turn, latches the column address and applies the latched column address to a plurality of column decoders 116A-D. The bank control logic 106 activates the column decoder 116A-D corresponding to the received bank address, and the activated column decoder decodes the applied column address. Depending on the operating mode of the memory device 100, the column address counter and latch 114 either directly applies the latched column address to the decoders 116A-D, or applies a sequence of column addresses to the decoders starting at the column address provided by the address register 102. In response to the column address from the counter and latch 114, the activated column decoder 116A-D applies decode and control signals to an I/O gating and data masking circuit 118 which, in turn, accesses memory cells corresponding to the decoded column address in the activated row of memory cells in the memory bank 112A-D being accessed.

During a data read command, data is read from the addressed memory cells and coupled through the I/O gating and data masking circuit 118 to a read latch 120. The I/O gating and data masking circuit 118 supplies N bits of data to the read latch 120, which then applies four N/4 bit words to a multiplexer 122. The memory device 100 has a "4n" prefetch architecture, where four sets of n-bit wide data are retrieved for each memory access. The memory device 100 is shown in FIG. 1 as a "x4" memory device, providing and receiving 4-bit wide data in response to each clock edge of the CLK and CLK# signals, as will be explained in more detail below. Since the memory device has a 4n prefetch architecture, and is a x4 data width, the circuit 118 provides 16 bits to the read latch 120 which, in turn, provides four 4-bit words to the multiplexer 122. A data driver 124 sequentially receives the N/4 bit words DATA from the multiplexer 122 and also receives a data strobe signal DQS from a strobe signal generator 126 and a delayed clock signal CLKDEL from the delay-locked loop ("DLL") 127. The DQS signal is used by an external circuit such as a memory controller (not shown) for synchronizing receipt of read data during read operations. In response to the delayed clock signal CLKDEL, the driver circuits of the I/O buffer 124 sequentially output the received DATA on data terminals DQ0-DQ3 as a corresponding data word. Each data word is output onto a data bus in synchronism with rising and falling edges of a CLK signal that is applied to clock the memory device 100 and the first data word is output at a time following registration of the read command in accordance with the programmed CAS latency. The data driver 124 also outputs the data strobe signal DQS having rising and falling edges in synchronism with rising and falling edges of the CLK signal, respectively.

During data write operations, an external circuit such as a memory controller (not shown) applies N/4 bit data words to the data terminals DQ0-DQ3, the strobe signal DQS, and corresponding data masking signals DM on the data bus. A data receiver 128 receives each data word and the associated DM signals, and applies these signals to input registers 130 that are clocked by the DQS signal. In response to a rising edge of the DQS signal, the input registers 130 latch a first N/4 bit data word and the associated DM signals, and in response to a falling edge of the DQS signal the input registers latch the second N/4 bit data word and associated DM signals. The input register 130 provides the four latched N/4 bit data words as an N-bit word to a write FIFO and driver 132, which clocks the applied data word and DM signals into the write FIFO and driver in response to the DQS signal. The data word is clocked out of the write FIFO and driver 132 in response to the CLK signal, and is applied to the I/O gating and masking circuit 118. The I/O gating and masking circuit 118 transfers the data word to the addressed memory cells in the accessed bank 112A-D subject to the DM signals, which may be used to selectively mask bits or groups of bits in the data words (i.e., in the write data) being written to the addressed memory cells.

FIGS. 2A and 2B illustrate mode registers 200 and 250 according to an embodiment of the present invention. The mode registers 200 and 250 are included in the mode register 135 (FIG. 1). As previously discussed, various modes of operation for the memory device 100 can be set using the mode registers 135.

The mode register 200 illustrates the different modes of operation that can be set and the bit allocation for each of the modes. The mode register 200 includes a mode register set of 12-bits, which are programmed by providing the appropriate bit values to the address bus of the memory device 100 when a load mode register command is issued. The 12 bits of the mode register 200 are numbered A<11:0>, corresponding to 12-bits applied to the address bus. Three bits B<2:0> are used to select the mode register 200 when programming values to a mode register. The bits B<2:0> correspond to 3-bits of a bank address applied to the address with the address and load mode register command. The mode register 200 corresponds to a bit value of "000" for B<2:0>.

As shown in FIG. 2A, three bits A<2:0> are used to set a burst length ("BL") for read and write operations for the memory device 100. As known in the art, the burst length determines the maximum number of column locations that can be accessed for a given read or write command. As shown in FIG. 2, a value of "010" is programmed for bits A<2:0> for a burst length of four, and a value of "011" is programmed for a burst length of eight. A bit A<3> is defined for setting a burst type ("BT") of the memory device 100. The burst type defines the order in which the data is provided by the memory device on the data terminals. As shown in FIG. 2, programming a value of "0" for the bit A<3> sets a sequential burst mode where the data is provided in a sequential manner, and programming a value of "1" selects an interleaved burst mode where the data is provided in an interleaved manner.

Bits A<6:4> are defined for setting a CAS latency ("CL") in terms of a number of clock cycles. As previously discussed, the CAS latency is a delay in clock cycles between the registration of a read command by the memory device 100 and the availability of the first bit of output data. As also previously discussed, the CAS latency is related to a minimum time for a read operation to complete internally. As higher frequency system clocks are used, but the time for the read operation to complete internally is not correspondingly reduced, a memory device will need to provide greater CAS latency to accommodate the higher frequency clock signals. However, in order for the same memory device to properly function in different systems using lower system clock frequencies, lower CAS latencies need to be provided as well. Thus, a memory device that is designed to properly operate for a variety of different clock frequencies should have a range of programmable CAS latencies that accommodate the range of acceptable system clock frequencies. The greater the range of CAS latencies, the greater the flexibility in using the memory device with different clock frequencies. As will be described in greater detail below, although only 3-bits A<6:4> are programmed in the mode register 200 to set a CAS latency, the present embodiment of the invention provides 16 different CAS latencies, and has a range of CAS latencies that allows the memory device 100 to operate over a range of four-times a minimum clock frequency.

A bit A<7> is used to set a test mode ("TM"). Typically, the test mode is not invoked after the memory device 100 has been tested following manufacture. Programming the bit A<7> to a "0" sets the memory device 100 under normal operating conditions, whereas programming a "1" enables operation in a test mode. A bit A<8> is used to provide a DLL reset ("DLL") feature. The DLL 127 is reset in response to a "1" being programmed for the bit A<8>. Typically, after the bit A<8> is programmed to a "1" and the DLL 127 is reset, the bit A<8> automatically clears back to a "0" to return to normal operation.

Bits A<11:9> are used to set a write latency ("WL") operating mode. As known, write latency is a delay, in clock cycles, between the registration of a write command and when the data should be made available at the data terminals of the memory device 100. Typically, write latency for many memory devices is not programmable, but is automatically set to be one clock cycle less than the programmed CAS latency instead. However, as greater system clock frequencies are used, resulting in a greater range of possible clock frequencies with which a memory device can be used, more recently developed memory devices have been designed to have separately programmable write and CAS latencies. Write operations generally can begin as soon as the write data is made available at the data terminals, whereas the time at which data is made available following a read command is limited by the speed of the internal operations of the memory device. Thus, it is unnecessary to have the write latency related to CAS, or read latency. As shown in FIG. 2, four write latencies are available. Programming the bits A<11:9> with "001" sets a write latency of one clock cycle, programming a "010" sets a write latency of two clock cycles, programming a "011" sets a write latency of three clock cycles, and programming a "100" sets a write latency of four clock cycles.

As previously discussed, FIG. 2B shows a mode register 250 included in the mode register 135 (FIG. 1) with the mode register 200. As will be discussed in greater detail below, data programmed in the mode register 250 select one of a plurality of sets of options for an operating mode defined in the mode register 250. The data programmed in the mode register 200 selects one choice from the set of options selected by the data programmed in the mode register 250. The mode register 250 includes 12-bits, and can be selected by providing a bank address of "010" to the address bus when a load mode register command is issued to the memory device 100. As with the mode register 200, the 12 bits A<11:0> of the mode register 250 correspond to 12-bits applied to the address bus while programming. As shown in FIG. 2B, a bit A<0> is defined for setting a CAS latency overflow option ("CLOF"). In the present embodiment, the CLOF bit of A<0> for the mode register 250 enables the use of two different sets of CAS latencies for programming by the three-bits A<6:4> of the mode register 200. Programming a "0" for the bit A<0> of the mode register 250 selects a first set of CAS latencies ranging from CL=5 to CL=12, and programming a "1" for the bit A<0> of the mode register 250 selects a second set of CAS latencies ranging from CL=13 to CL=20. The bits A<11:1> are shown in FIG. 2B as being reserved for future use ("RFU"), indicating that the bits are undefined for setting any modes of operation. The bits A<11:1> are shown as RFU for the present embodiment since defining different modes is not necessary for describing operation of the present example. As understood by those ordinarily skilled in the art, however, the memory device 100 can be designed to have a variety of different modes of operation defined for the bits A<11:1> of the mode register 250. Thus, having modes of operation defined for the bits A<11:1> of the mode register 250, or defined for any number of those bits, remains within the scope of the present invention.

Figure 3:
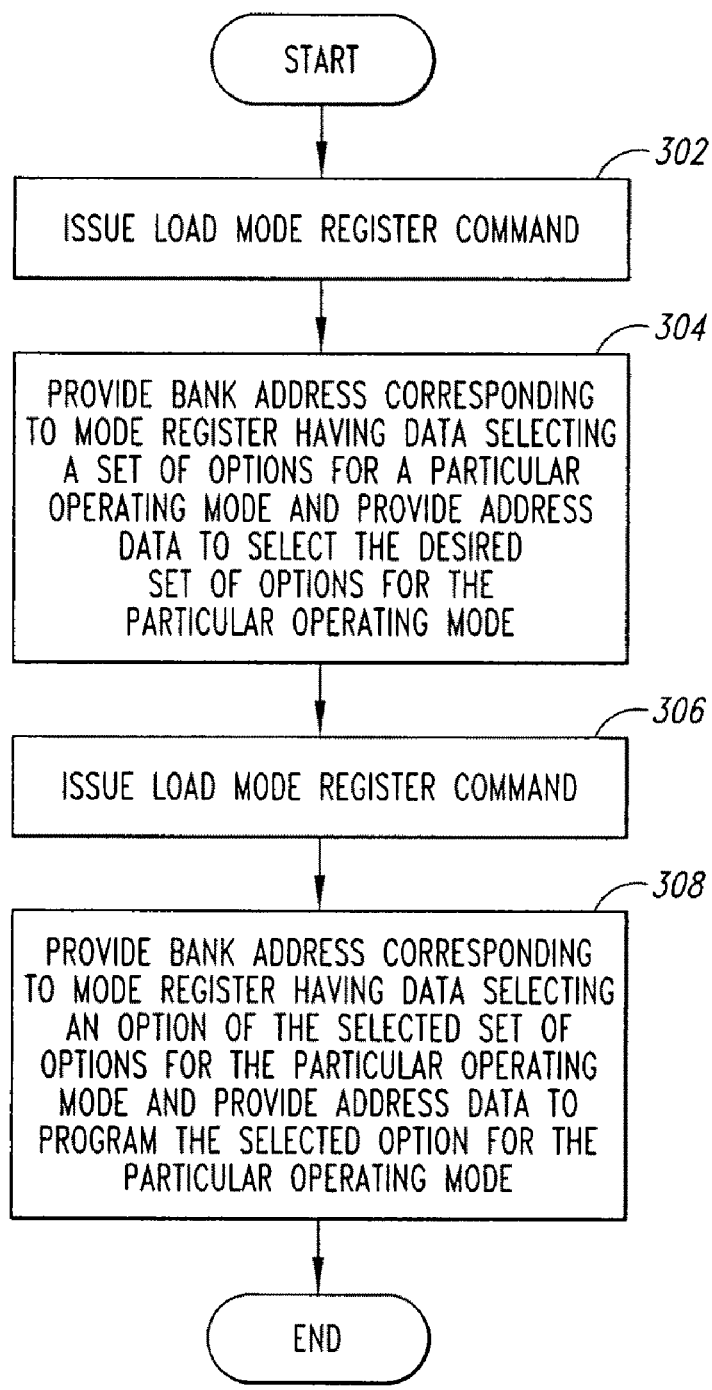
FIG. 3 is a flow diagram for programming mode register sets of bits according to an embodiment of the present invention in mode registers.

In operation, the bits A<6:4> of the mode register 200 and the bit A<0> of the mode register 250 are used in combination to set one of 16 different CAS latencies for the memory device 100. FIG. 3 illustrates a process of programming the mode registers 200 and 250. A particular CAS latency from a first CAS latency option set, for example, CL=11, is selected by programming the bit A<0> of the mode register 250 to CLOF=0. At step 302 a load mode register command is provided to the memory device 100. A bank address of "010" to select the mode register 250, and an address that includes the bit A<0> 0, are also provided at step 304 to program the bit A<0>. The other bits A<1 1:0> are "do not care" bits for the present example since programming the bit A<0> is used for selecting between two different sets of CAS latency options. After programming the bit A<0> for the mode register 250, another load mode register command is provided to the memory device 100 at step 306 for programming the mode register set of bits for the mode register 200. At a step 308, a bank address of "000" is provided to the memory device 100 to select the mode register 200, along with an address including the bit values for A<6:4> equal to "011" to select CL=11 of the first set of CAS latency options, which is selected by the bit A<0> previously programmed in the mode register 250. In performing read operations, the command decoder 134 (FIG. 1) will interpret the bits A<6:4> of the mode register 200 programmed to "011," and bit A<0> of the mode register 250 programmed to "0" to provide the selected CAS latency of CL=11. As a result, the memory device 100 will make the read data available at the data terminals 11 clock cycles after a read command is registered.

To program a particular CAS latency from a second set of CAS latency options, for example, CL=13, a process similar to that previously described can be used. A load mode command is issued to the memory device 100 along with a bank address of "010" to specify loading of the mode register 250. An address that includes bit A<0> having a "1" value is also provided to the memory device 100 to program the bit A<0> and select the second set of CAS latency options. The bits A<11:1> are again "do not care," as previously described for setting CL=11. After issuing the load mode register command and programming the bit A<0> of the mode register 250 to select the second set of CAS latency options, another load mode command is issued to the memory device 100. A bank address of "000" is provided to specify programming a mode register set of bits for the mode register 200, and an address including "101" for the bits A<6:4> is provided to the memory device 100 as well. The CAS latency of CL=13 is selected from the second set of CAS latency options as a result of programming a "1" for the bit A<0> for the mode register 250 and programming a value of "101" to the bits A<6:4>of the mode register 200. In performing read operations, the command decoder 134 (FIG. 1) will interpret the mode register set of bits for the mode register 200, particularly the bits A<6:4> programmed to "101," and the bits of the mode register 250, particularly the bit A<0> programmed to "1," to provide the selected CAS latency of CL=13. As a result, the memory device 100 will make the read data available at the I/O terminals 13 clock cycles after a READ command is registered.

As illustrated by the previous examples, using the bits of the mode register set of bits from two different mode registers can provide a greater number of choices for a particular operating mode without the need to rearrange the bit allocation of the rest of a mode register set of bits. In the previous example, a total of 16 different CAS latencies are made available by using the bits A<6:4> of the mode register 200 and the bit A<0> of the mode register 250. In contrast, a total of 16 different CAS latencies could also have been provided by reallocating the bits A<11:0> of the mode register 200 to define four bits for selecting a CAS latency. However, this approach necessarily requires one of the operating modes defined for the mode register 200 to sacrifice a bit, or remove an operating mode from the mode register 200. Either approach can be undesirable. In one case, reducing another operating mode selection by one bit reduces the number of choices for the operating mode by one-half. In removing an operating mode from one mode register and moving it to another mode register, the applicability of the memory device may be limited to newer systems having memory controllers capable of programming the operating mode in the new mode register, or at the very least, reprogramming of a legacy memory controller may be required.

Adding a greater range of choices for an operating mode as previously described provides benefits when attempting to design a memory device that can be used in legacy systems as well as newer systems. By retaining the same bit definition for operating modes of a mode register, a memory device can be used in older systems without the need to reprogram a memory controller. For example, in the previously described example, the first set of CAS latency options provides a range of CAS latency from 5 to 12 (FIGS. 2A and 2B), with a CAS latency of five selected by programming "101" for bits A<6:4>. As a result, the memory device 100 can be used in a legacy system that has a system clock with a clock frequency that requires a CAS latency of five. However, the memory device 100 can also be used in a newer system having a higher frequency system clock that may require two-times or three-times the CAS latency because of the wide range of CAS latencies provided by the first and second sets of CAS latency options. Additionally, the sequence of the choices for CAS latency can be selected so that a memory controller of a legacy system does not need to be reprogrammed for use with a memory device having a greater range of CAS latencies. For example, where the memory controller chooses a CAS latency of five by programming bits A<6:4> with a "101," which is the binary value equivalent to five, the correct CAS latency of five will still be programmed for the memory device because programming bits A<6:4> with "101" in that embodiment also chooses a CAS latency of five.

The same memory device, as previously mentioned, can also be used in a newer system that requires a much longer CAS latency because of a higher system clock frequency. Since the newer system will likely be designed with such a memory device in mind, the memory controller will be programmed to take advantage of the greater range of CAS latencies provided. For example, assuming that the system clock frequency of the newer system is three times that of the legacy system previously described that uses a CAS latency of five, a CAS latency that is three times that of the legacy system may be required for proper operation in the new system. The resulting CAS latency for the new system may be as high as CL=15. By having the memory controller of the new system program a "1" for the bit A<0> of the mode register 250, and program "111" for bits A<6:4> for the mode register 200, a CAS latency of 15 can be selected.

As illustrated by the previous examples, selection of one of two sets of CAS latency options is made by programming the appropriate value for bit A<0> of the mode register 250. Selection of one of the choices of the selected set of options is made by programming the appropriate value for bits A<6:4> of the mode register 200. Additionally, as previously discussed, using a bit of a first mode register set for selecting a set of options, and using bits of a second mode register to select a choice of the selected set of options, can be advantageously used in a memory device to provide operability in legacy systems as well as in newer systems that require additional choices for typical operating modes for operation of the memory device.

Alternative embodiments of the present invention can be used to select sets of options for operating modes other than CAS latency. Generally, embodiments of the present invention can be utilized to provide selection of one of a plurality of sets of options by programming at least one bit of a first mode register and selecting one of the selected set of options by programming bits of a second mode register. Application to another operating mode is illustrated in FIGS. 4A and 4B.

As shown in FIG. 4A, an output drive strength ("ODS") option can be set using bit A<7> of a first mode register 400. The operation modes programmed by the mode register set of bits for the mode register 400 is similar to that for the first mode register 200 of FIG. 2A, except that A<7> is shown in FIG. 4A for programming the output drive strength instead of programming a test mode option. The output drive strength operating mode allows the output voltage level to be adjusted for application with a particular capacitive loading. In some applications, such as for a memory module where a shared data bus has relatively high capacitive loading, the output drive strength should be 100% to provide the full voltage swing available to drive signals on a memory bus. However, in other applications, such as using the memory device as a local memory coupled through a dedicated data bus having a low capacitive loading, the drive strength can be lowered to avoid signal bounce and other issues associated with overshoot. As shown in FIG. 4A, the only choice other than 100% for the output drive strength is 60%. However, in some applications it may be desirable to have another choice for yet a lower output drive strength.

FIG. 4B illustrates a second mode register 450 that includes a bit A<1> that can be used as a drive strength overflow ("DSOF") bit to provide a second set of output drive strength options that includes a lower drive strength choice. The second set of output drive strength options shown in FIG. 4B includes a selection for an output drive strength of 33%. Selecting the second set of output drive strength options is accomplished by programming the bit A<1> of the second mode register 450 with a "1." Under this condition, programming a "0" for bit A<7> of the first mode register 400 chooses an output drive strength of 33%. As shown in FIG. 4B, the condition for DSOF=1 (selecting the second set of output drive strength options) and ODS=1 is reserved for future use. As illustrated by this example, not all of the available choices of a set of options need to correspond to a selectable choice.

Figure 5:
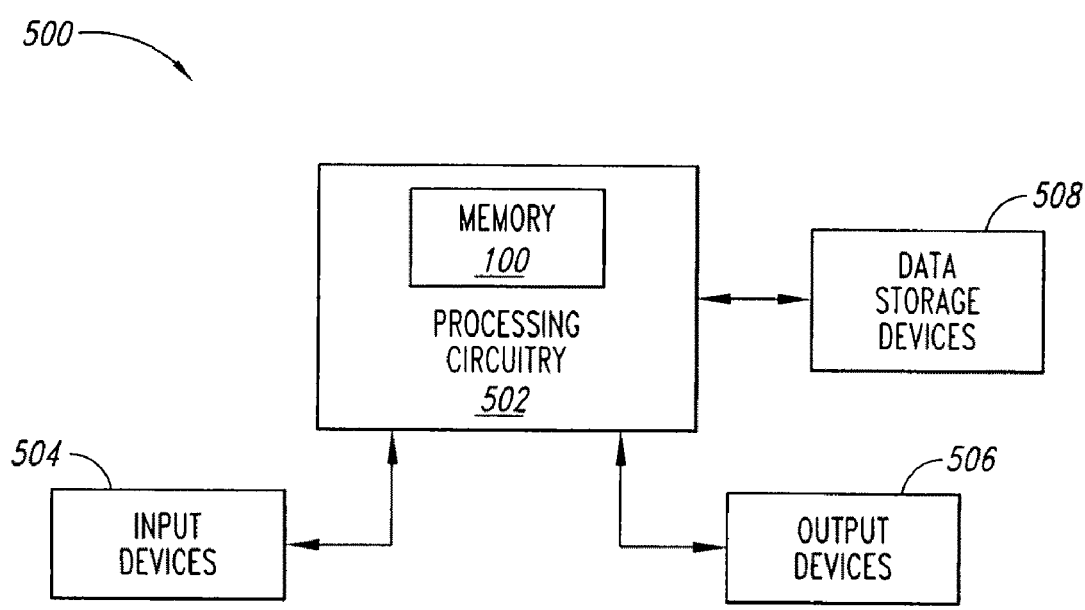
FIG. 5 is a block diagram of a processor-based system including the memory device of FIG. 1.

FIG. 5 is a block diagram of a processor-based system 500 having processing circuitry 502 that includes the memory device 100 of FIG. 1. Typically, the processing circuitry 502 is coupled through address, data, and control buses to the memory device 100 to provide for writing data to and reading data from the memory device. The processing circuitry 502 includes circuitry for performing various computing functions, such as executing specific software to perform specific calculations or tasks. In addition, the processor-based system 500 includes one or more input devices 504, such as a keyboard or a mouse, coupled to the processing circuitry 502 to allow an operator to interface with the processor-based system 500. Typically, the processor-based system 500 also includes one or more output devices 506 coupled to the processing circuitry 502, such as output devices typically including a printer and a video terminal. One or more data storage devices 508 are also typically coupled to the processing circuitry 502 to store data or retrieve data from external storage media (not shown). Examples of typical storage devices 508 include hard and floppy disks, tape cassettes, compact disk read-only ("CD-ROMs") and compact disk read-write ("CD-RW") memories, and digital video disks ("DVDs").

From the foregoing it will be appreciated that, although specific embodiments of the invention have been described herein for purposes of illustration, various modifications may be made without deviating from the spirit and scope of the invention. For example, the specific embodiments described herein have been directed to providing multiple sets of options for CAS latency and output drive strength. Moreover, only two sets of options have been described for each of these operating modes. However, the present invention is not limited in application to the particular operating modes described herein, or limited to providing only two sets of options for an operating mode. Alternative embodiments provide multiple sets of options for various operating modes that can be programmed in a first mode register, such as burst length, write latency, and other operating modes now known in the art or later developed. Additionally, although embodiments of the invention have been described herein with application to memory devices, alternative embodiments can be used in other systems having multiple modes of operation that can be programmed through the use of mode registers. Accordingly, the invention is not limited except as by the appended claims.

What is claimed is:

1. A mode register coupled to a command decoder logic, the mode register comprising:
   a first register configured to store data selecting an option for at least one mode of operation; and
   a second register configured to be programmed with data selecting one of a plurality of sets of options for the at least one mode of operation responsive to command signals received by the command decoder logic, each set of options having a plurality of options selectable by the data stored in the first register.

2. The mode register of claim 1 wherein the at least one mode of operation comprises a read latency option and wherein the plurality of sets of options for the at least one mode of operation comprises a first range of read latencies and a second range of read latencies, the first and second ranges of read latencies having at least one different read latency.

3. The mode register of claim 1 wherein the at least one mode of operation comprises an output drive strength option and wherein the plurality of sets of options for the at least one mode of operation comprises a first range of output drive strengths and a second range of output drive strengths, the first and second ranges of output drive strengths having at least one different output drive strength.

4. The mode register of claim 1 wherein the first register comprises a register configured to store N-bit data for selecting an option for the at least one mode of operation and each set of options selected by the data programmed in the second register has no more than $2^N$ selections from which to choose.

5. The mode register of claim 1 wherein the first register comprises a register configured to store data representative of a respective plurality of sets of options for each of a plurality of operational modes, and wherein the second register comprises a register configured to be programmed to select one of the respective plurality of sets of options for at least one of the plurality of operational modes.

6. A control logic of a memory device, comprising:
   a command decoder logic operable to receive command signals;
   a first register coupled to the command decoder logic and having data embodying a plurality of sets of options; and
   a second register coupled to the command decoder logic and configured to be programmed based on the received command signals to select one of the plurality of sets of options.

7. The control logic of claim 6 wherein the plurality of sets of options comprises a set of read latency options.

8. The control logic of claim 6 wherein the plurality of sets of options comprises a set of output drive strength options.

9. The control logic of claim 6 wherein the second register comprises a register having M-bit data for selecting one of (2×M) different sets of options.

10. The control logic of claim 6 wherein the first register comprises a register having data embodying a respective plurality of sets of options for each of a plurality of operational modes, and wherein the second register comprises a register configured to be programmed to select one of the respective plurality of sets of options for at least one of the plurality of operational modes.

11. A memory device, comprising:
    an address bus;
    a control bus;
    a data bus
    an address decoder coupled to the address bus;
    a data access circuit coupled to the data bus;
    a memory cell array coupled to the address decoder and data access circuit; and
    a control circuit coupled to the control bus, the address decoder, the memory cell array and the data access circuit, the control circuit having a command decoder to receive command signals and generate internal control signals in response to the received command signals, the command decoder comprising:
       a first register having first data embodying a plurality of sets of options;
       a second register having second data the value of which is updated responsive to the received command signals to select one of the plurality of sets of options; and
       a command decoder logic coupled to the first and second registers and configured to generate the internal control signals responsive to the received command signals, the first data and the second data.

12. The memory device of claim 11 wherein the plurality of sets of options comprises a set of read latency options.

13. The memory device of claim 11 wherein the plurality of sets of options comprises a set of output drive strength options.

14. The memory device of claim 11 wherein the second register comprises a register having M-bit data for selecting one of (2×M) different sets of options.

15. The memory device of claim 11 wherein the first register comprises a register having data embodying a respective plurality of sets of options for each of a plurality of operational modes, and wherein the second register comprises a register configured to be programmed to select one of the respective plurality of sets of options for at least one of the plurality of operational modes.

16. A method of programming modes of operation for a memory responsive to command signals, comprising:
    providing a first register having first data embodying a plurality of sets of options for at least one mode of operation; and providing a second register having second data to select one of the sets of options for the at least one mode of operation in response to the command signals.

17. The method of claim 16 wherein providing a second register having second data comprises providing a second register having M-bit data to select one of (2×M) sets of options for the at least one mode of operation.

18. The method of claim 16 wherein providing a first register having first data comprises providing a first register having N-bit data to embody no more than $2^N$ options of the plurality of sets of options.

19. The method of claim 16 wherein the at least one mode of operation comprises read latency mode of operation.

20. The method of claim 16 wherein the at least one mode of operation comprises output drive strength mode of operation.

21. A method of increasing a number of selectable options for a particular operating mode of a semiconductor memory, the method comprising:
    providing N-bit data in a first register representing up to $2^N$ selectable options for the particular operating mode; and
    programming M-bit data in a second register to allow the N-bit data in the first register to represent up to $(2^M \times 2^N)$ selectable options for the particular operating mode.

22. The method of claim 21 wherein the particular operating mode comprises read latency operating mode.

23. The method of claim 21 wherein the particular operating mode comprises output drive strength operating mode.

24. A method of selecting a set of options for a mode of operation of a memory device, the method comprising:
    interpreting a set of data in a first register to mean a first set of options for the mode of operation; and
    interpreting the set of data in the first register to mean a second set of options for the mode of operation if a second register contains a predetermined value.

25. The method of claim 24 wherein the mode of operation is read latency mode of operation.

26. The method of claim 24 wherein the mode of operation is output drive strength mode of operation.

* * * * *

UNITED STATES PATENT AND TRADEMARK OFFICE
CERTIFICATE OF CORRECTION

| | | |
|---|---|---|
| PATENT NO. | : 7,433,248 B2 | Page 1 of 1 |
| APPLICATION NO. | : 11/701120 | |
| DATED | : October 7, 2008 | |
| INVENTOR(S) | : Choi | |

It is certified that error appears in the above-identified patent and that said Letters Patent is hereby corrected as shown below:

In column 1, line 3, above "This application" insert -- CROSS-REFERENCE TO RELATED APPLICATION --.

In column 12, line 27, in Claim 11, after "bus" insert -- ; --.

Signed and Sealed this

Tenth Day of March, 2009

JOHN DOLL
*Acting Director of the United States Patent and Trademark Office*